(12) United States Patent
Abadeer et al.

(10) Patent No.: US 7,262,987 B2
(45) Date of Patent: Aug. 28, 2007

(54) SRAM CELL USING TUNNEL CURRENT LOADING DEVICES

(75) Inventors: Wagdi W. Abadeer, Jericho, VT (US); John A. Fifield, Underhill, VT (US); Harold Pilo, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/906,056

(22) Filed: Feb. 1, 2005

(65) Prior Publication Data

US 2006/0171189 A1 Aug. 3, 2006

(51) Int. Cl.
*G11C 11/00* (2006.01)
(52) U.S. Cl. .................. 365/154; 365/161; 365/226
(58) Field of Classification Search .................. 365/154
See application file for complete search history.

(56) References Cited

U.S. PATENT DOCUMENTS

| | | | |
|---|---|---|---|
| 4,132,904 A | 1/1979 | Harari | |
| 4,939,567 A * | 7/1990 | Kenney | ....................... 257/383 |
| 5,053,638 A * | 10/1991 | Furutani et al. | ....... 365/185.03 |
| 5,497,022 A | 3/1996 | Sakamoto | |
| 5,825,684 A | 10/1998 | Lee | |
| 5,936,265 A | 8/1999 | Koga | |
| 6,104,631 A | 8/2000 | El-Sharawy et al. | |
| 6,178,110 B1 * | 1/2001 | Hayashi | ....................... 365/154 |
| 6,272,039 B1 | 8/2001 | Clemens et al. | |
| 6,301,147 B1 | 10/2001 | El-Sharawy et al. | |
| 6,493,282 B2 * | 12/2002 | Iida et al. | .................... 365/226 |
| 6,535,417 B2 * | 3/2003 | Tsuda et al. | ................. 365/154 |
| 6,940,778 B2 * | 9/2005 | Mellinger et al. | .......... 365/227 |
| 2001/0019137 A1 | 9/2001 | Koga et al. | |
| 2002/0024049 A1 * | 2/2002 | Nii et al. | ....................... 257/67 |
| 2004/0104407 A1 * | 6/2004 | Hsu | .......................... 257/200 |
| 2005/0146928 A1 * | 7/2005 | Luk et al. | .................... 365/175 |

* cited by examiner

*Primary Examiner*—Thong Q. Le
(74) *Attorney, Agent, or Firm*—Schmeiser, Olsen & Watts; William D. Sabo

(57) ABSTRACT

An SRAM cell with gate tunneling load devices. The SRAM cell uses PFET wordline transistors and NFET cross-coupled transistors. The PFET wordline transistors are fully conductive during read operations, thus a full voltage level is passed through the PFET to the high node of the cell from the bitline. Tunnel current load devices maintain the high node of the cell at full voltage level during standby state.

20 Claims, 7 Drawing Sheets

SRAM CELL USING TUNNEL CURRENT LOADING DEVICES

FIELD OF THE INVENTION

The present invention relates to the field of static storage elements; more specifically, it relates to a static random access memory (SRAM) cell using tunnel current loading n-channel field effect transistors (NFETs).

BACKGROUND OF THE INVENTION

Static storage devices such as SRAM cells use a write operation to store data in the cell and a read operation to sense the data stored in the cell. To ensure no read data disturbs occur, the write operation needs to write full power supply voltage levels to the SRAM cell so when the data is read it is not corrupted. In current SRAM cell designs, large P-channel field effect transistors (PFETs) are required to supply retention and write-recovery currents to maintain the full power supply voltage level. As integrated circuits become smaller and denser and as power consumption specifications for battery powered integrated circuits decrease, along with power supply voltages, the present SRAM cell designs are increasingly inefficient in both silicon area used and power consumed.

Therefore, there is a need for writing full power supply voltage levels to SRAM cells that have reduced area requirements and low power consumption.

SUMMARY OF THE INVENTION

The present invention provides an SRAM cell that can be written with full power supply voltage levels and has reduced area requirements and low power consumption compared to conventional SRAM cells by utilizing the tunneling leakage current of load devices to maintain the nodes of the SRAM cell at full power supply voltages levels.

A first aspect of the present invention is an integrated circuit, comprising: a node; a PFET connected between the node and a data signal source, a gate of the PFET coupled to a control signal source; a first NFET connected between the node and ground; and a second NFET, a gate of the second NFET connected to a power supply, a source and a drain of the second NFET both connected to the node.

A second aspect of the present invention is an integrated circuit, comprising: a first node and a second node; a first PFET connected between the first node and a first data signal source, a gate of the first PFET coupled to a control signal source; a second PFET connected between the second node and a second data signal source, a gate of the second PFET coupled to the control signal source; a first NFET connected between the first node and ground, a gate of the first NFET connected to the second node; a second NFET, a gate of the second NFET connected to a power supply, a source and a drain of the second NFET both connected to the first node; a third NFET connected between ground and the second node, a gate of the third NFET connected to the first node; and a fourth NFET, a gate of the fourth NFET connected to the power supply, a source and a drain of the fourth NFET both connected to the second node.

A third aspect of the present invention is a method, comprising: providing an SRAM cell, the SRAM cell comprising: a first node and a second node; a first PFET connected between the first node and a true bitline, a gate of the first PFET coupled to a wordline; a second PFET connected between the second node and a complimentary bitline, a gate of the second PFET coupled to the wordline; a first NFET connected between the first node and ground, a gate of the first NFET connected to the second node; a second NFET, a gate of the second NFET connected to a power supply, a source and a drain of the second NFET both connected to the first node; a third NFET connected between ground and the second node, a gate of the third NFET connected to the first node; and a fourth NFET, a gate of the fourth NFET connected to the power supply, a source and a drain of the fourth NFET both connected to the second node.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

For the purposes of the present invention the term gate current, tunneling leakage current and gate tunneling leakage current should be considered as equivalent terms. It should be understood that the structure of PFETs and NFETs used in the present invention in their simplest form comprise a gate electrode over a gate dielectric over a channel region in a semiconductor substrate with a source and a drain formed in the substrate on opposite sides of the channel region. However, more structurally complex PFETs and NFETs as known in the art may be used as well.

Figure 1:
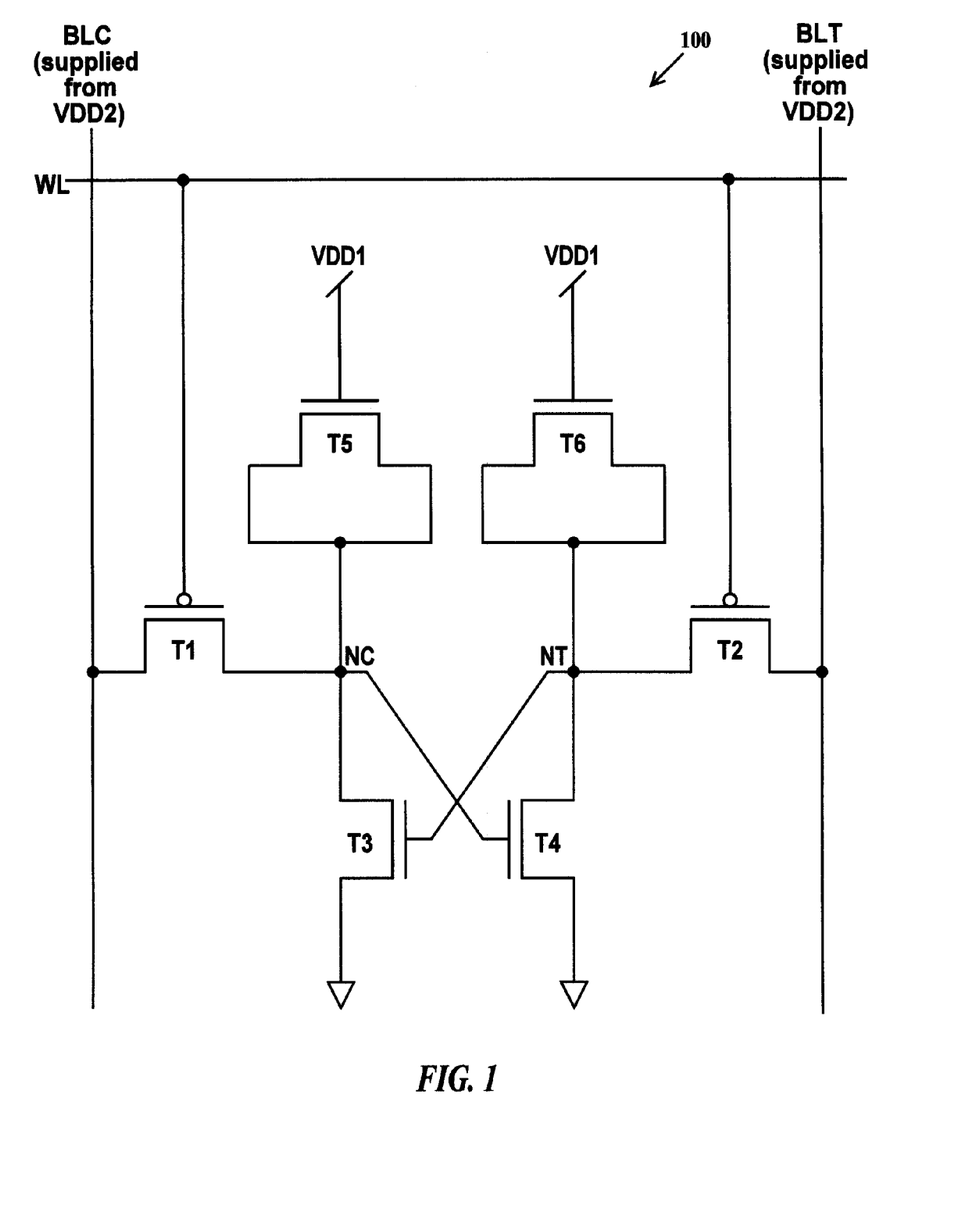
FIG. 1 is a schematic circuit diagram of an SRAM cell according to the present invention.

FIG. 1 is a schematic circuit diagram of an SRAM cell according to the present invention. In FIG. 1, an SRAM cell 100 includes PFETs T1 and T2 and NFETs T3, T4, T5 and T6. The source of PFET T1 is coupled to bitline BLC (bitline complement), the drain of PFET T1 is coupled to a node NC and the gate of PFET T1 is coupled to a wordline WL. The source of PFET T2 is coupled to bitline BLT (bitline true), the drain of PFET T2 is coupled to a node NT and the gate of PFET T2 is coupled to wordline WL. The source of NFET T3 is coupled to GND (ground), the drain of NFET T3 is coupled to node NC and the gate of NFET T3 is coupled to node NT. The source of NFET T4 is coupled to GND, the drain of NFET T4 is coupled to node NT and the gate of NFET T4 is coupled to node NC. The source and drain of NFET T5 are coupled to node NC and the gate of NFET T5 is coupled to VDD1. The source and drain of NFET T6 are coupled to node NT and the gate of NFET T6 is coupled to VDD1. Wordline WL carries a control signal often referred to a wordline signal, thus wordline WL may be considered a control signal source. Bitlines BLC and BLT carry data bit signals and may be considered data signal sources. Wordline WL, and bitlines BLC and BLT are supplied from a power supply VDD2. In a first example VDD1 is equal to VDD2. In a second example VDD1 is greater than VDD2. The term full POWER SUPPLY voltage swing when applied to read and write operations of SRAM cell 100 refers to a swing between VDD1 and GND of node NC or node NT and a swing between VDD2 and GND of the signal on bitline BLC or bitline BLT.

To write a logical 1 to SRAM cell 100 wordline WL is turned on (at GND), turning PFETs T1 and T2 on, so with bitline BLT at GND and bitline BLC at VDD2, node NC rises to VDD2 and node NT falls to GND.

To write a logical 0 to SRAM cell 100 wordline WL is turned on (at GND), turning on PFETs T1 and T2, so with bitline BLC at GND and bitline BLT at VDD2, node NC falls to GND and node NT rises to VDD2.

Because of current leakage through NFET T3 and T4 respective nodes NC or NT will discharge over time and the voltage level on nodes NC or NT will drop. It is the node (NC or NT) at VDD2 that is of concern for leakage current. If the voltage drops to a predetermined level below VDD2, read stability and read performance specifications may be compromised and data errors on read operations may occur.

NFETS T5 and T6 supply retention current to respective nodes NC or NT to compensate for the leakage through NFETs T3 and T4 by keeping the HIGH node at VDD1 and the LOW node is at GND.

There are two types of gate tunneling current leakage, inversion tunneling current leakage and accumulation tunneling current leakage. Inversion tunneling current leakage occurs when the gate of an NFET is at VDD2. Accumulation tunneling current leakage occurs when the gate of an NFET is at GND. NFETs T5 and T6 are load devices operated in inversion mode in SRAM cell 100.

The write recovery operation is also of concern because the node NT or NC must be pulled to VDD2 very quickly and that requires a substantial amount of current. In conventional SRAM cells NFETs T5 and T6 are PFET devices that pull the internal nodes NC or NT to VDD2. Generally, without NFETs T5 and T6, the node (NT or NC) would discharge from VDD2 due to current leakage through NFETs T3 or T4.

In the example of SRAM cell 100 storing a logical 1 (NT at GND NC at VDD2), the retention current (which is a gate tunneling current) supplied by NFET T5 ($I_{TUNT5}$) should be about equal to or greater than the sub-threshold voltage leakage current through NFET T3 ($I_{SUBVTT3}$) plus the gate tunneling current through NFET T4 ($I_{TUNT4}$) minus the sub-threshold voltage leakage current through PFET T1 ($I_{SUBVTT1}$). It should be understood that $I_{TUNT5}$ and $I_{TUNT4}$ are inversion gate tunneling currents through NFETs T5 and T4 respectively and that $I_{SUBVTT1}$ and $I_{SUBVTT3}$ are sub-threshold voltage leakage currents through PFET T1 and NFET T3 respectively.

In the example of SRAM cell 100 storing a logical 0 (NT at VDD2, NC at GND), the retention current (which is a gate tunneling current) supplied by NFET T6 ($I_{TUNT6}$) should be greater than the sub-threshold voltage leakage current through NFET T4 ($I_{SUBVTT4}$) plus the gate tunneling current through NFET T3 ($I_{TUNT3}$) minus the sub-threshold voltage leakage current through PFET T2 ($I_{SUBVTT2}$). Again, it should be understood that $I_{TUNT6}$ and $I_{TUNT3}$ are inversion gate tunneling currents through NFETs T6 and T3, respectively and that $I_{SUBVTT2}$ and $I_{SUBVTT4}$ are sub-threshold voltage leakage currents through PFET T2 and NFET T4, respectively.

The amount of gate tunneling inversion current through NFET T6 (or NFET T5) is controlled by the value of VDD1, the gate dielectric thickness and the dielectric constant of the gate dielectric. When comparing gate dielectric thicknesses, electrically equivalent gate dielectric thicknesses are compared. The electrically equivalent gate dielectric thickness takes into account the different permittivity of different dielectric materials, because it is possible for a thin layer of a dielectric material with a high permittivity to have a higher electrically equivalent gate dielectric thickness than a physically thicker layer of a dielectric material with a lower permittivity. Since thermal silicon oxide is a traditional, well characterized and common dielectric material, gate dielectric thickness is often described in terms of thermal silicon oxide equivalent ($T_{OXEQ}$) thickness which is the physical thickness of the gate dielectric multiplied by the ratio of the permittivity of thermal silicon oxide divided by the permittivity of the material of the gate dielectric.

In one example, the area of gate over channel region of NFETs T5 and T6 may be greater than the area of gate over channel region of NFETs T3 and T4 to allow for more current drive to maintain respective nodes NC or NT at VDD2. In one example, the $T_{OXEQ}$ of PFETs T1 and T2 may be about the same as the $T_{OXEQ}$ of NFETs T5 and T6 to take advantage of the fact that sub-threshold leakage through PFETs T1 or T2 will also help to maintain nodes NC or NT respectively at VDD2.

Figure 2:
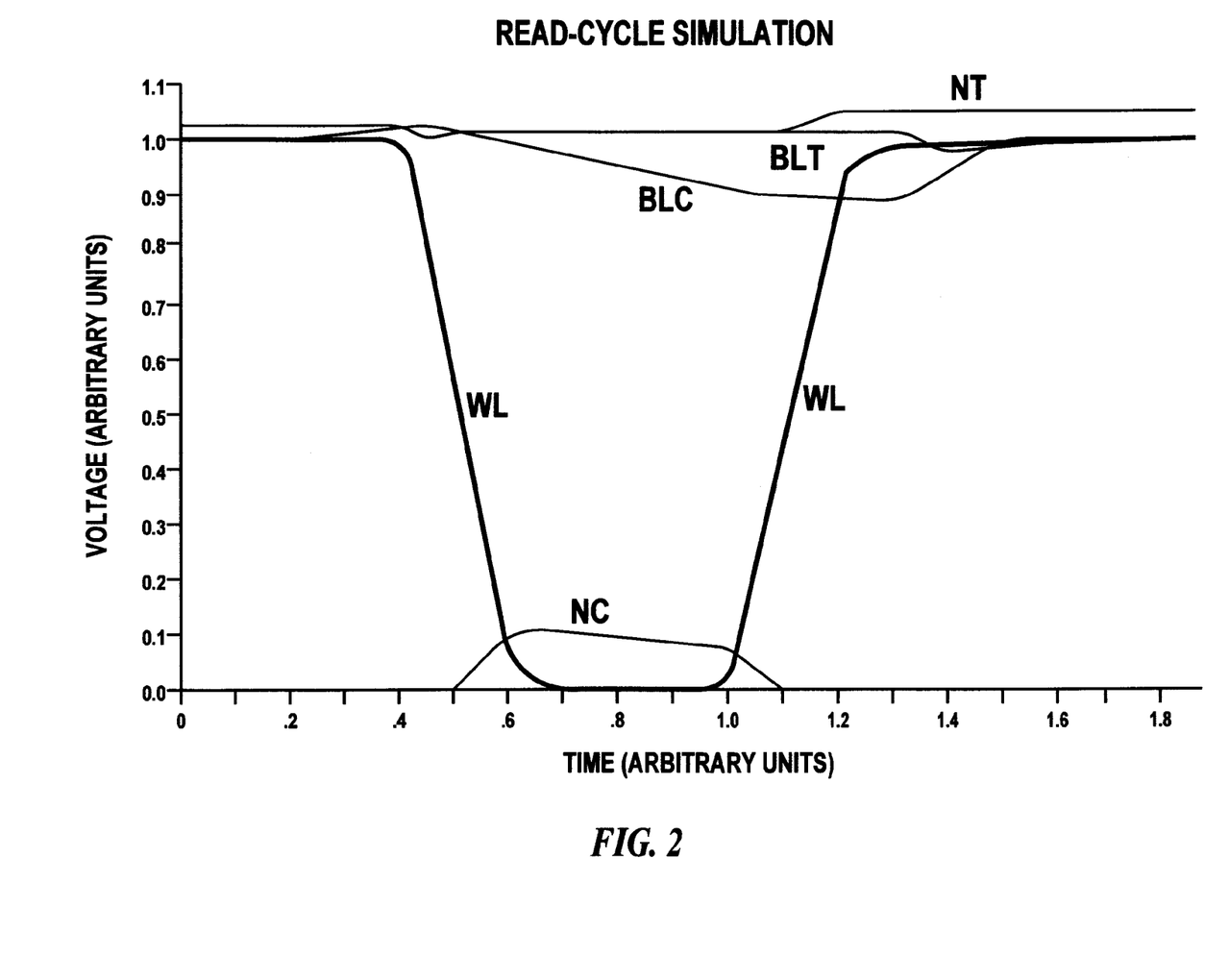
FIG. 2 is a read-cycle simulation of an SRAM cell according to the present invention.

FIG. 2 is a read-cycle simulation of an SRAM cell according to the present invention. Reference to FIG. 1 during the following discussion will be helpful. In FIG. 2, the SRAM cell is holding a logical 0 (node NT at VDD2 and node NC at GND). As wordline WL is turned on (transitions from high voltage to low voltage) node NT and bitline BLT remain at the full power supply voltage, node NC charges to about 10% of the power supply voltage and bitline BLC discharges to about 90% of the power supply-voltage. As wordline WL is turned off (transitions from low voltage to high voltage) node NT and bitline BLT remain at a full power supply voltage level, node NC discharges to GND and bitline BLC is pre-charged to a full power supply voltage level. Thus, operation of an SRAM cell according to the present invention is highly reliable in terms of read stability.

FIGS. 3 through 6 and the discussion infra describe determination of NFET gate current (tunneling leakage) in amperes/um$^2$ as a function of temperature, $T_{OXEQ}$ and gate voltage ($V_G$) and are useful in designing SRAM cell 100 (see FIG. 1).

Figure 3:
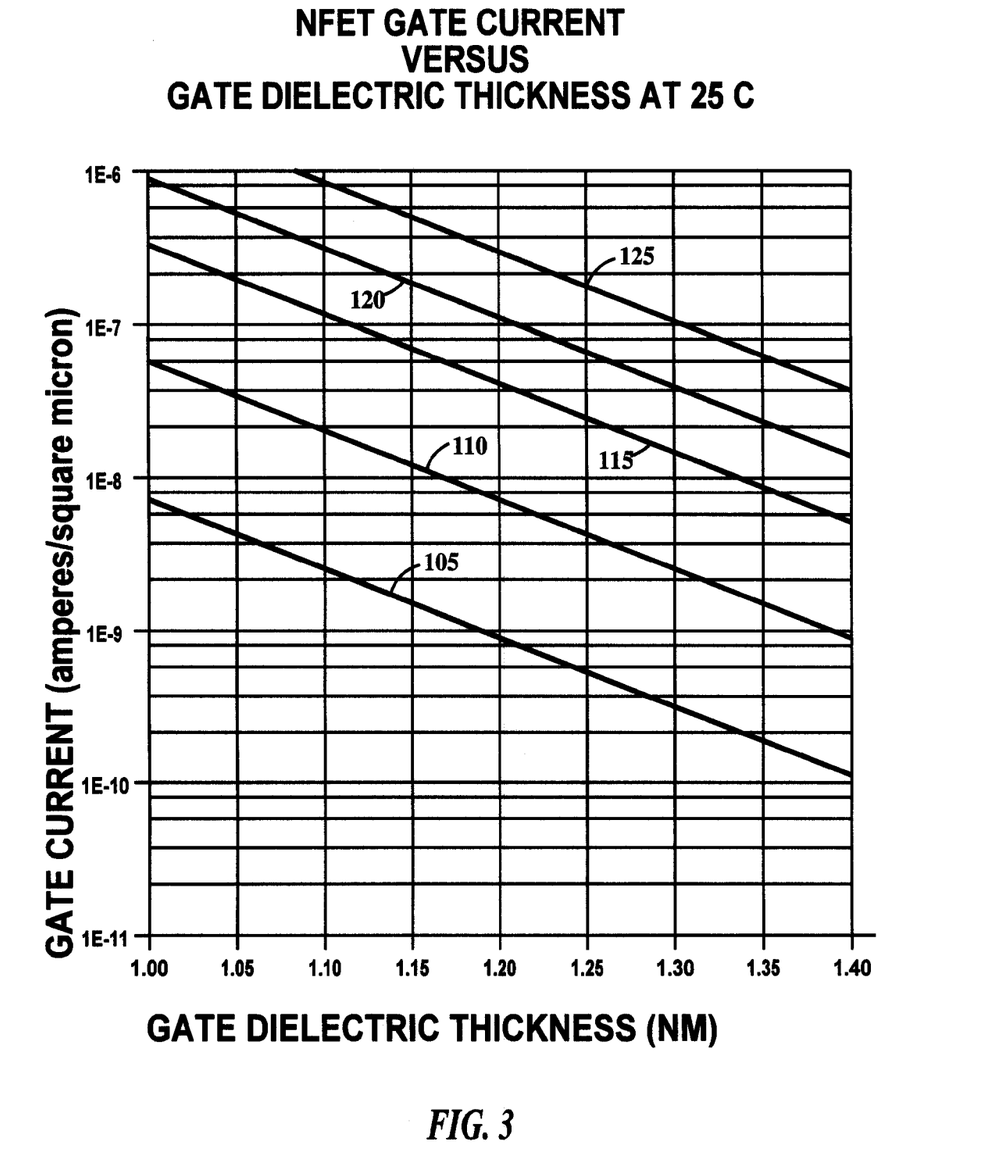
FIG. 3 is a plot of NFET gate current versus gate dielectric thickness for various gate voltages.

FIG. 3 is a plot of NFET gate current versus gate dielectric thickness for various gate voltages. All curves were plotted for NFETs at 25° C. with the NFETs in inversion mode. In FIG. 3, curve 105 is for a gate voltage of 0.2 volts, curve 110 is for a gate voltage of 0.4 volts curve 115 is for a gate voltage of 0.6 volts, curve 120 is for a gate voltage of 0.8 volts and curve 125 is for a gate voltage of 1.0 volts. The gate dielectric thickness ($T_{OXEQ}$) has been measured electrically in FIG. 3. FIG. 3 illustrates that gate current on a natural logarithmic scale is a linear function of $T_{OXEQ}$ where the slope and intercept of the straight-line function are functions of the gate voltage. (Note, because the gate current is a log scale, the slopes of curves 105, 110, 125, 120 and 125 are parallel, but the slopes increase from curve 105 through 125.) FIG. 3 may be used, in a first example, to select appropriate $T_{OXEQ}$ values for NFETs T3, T4, T5 and T6 (see FIG. 1) when operated at the same voltages to ensure more gate tunneling leakage current through NFETs T5 and T6 than through NFETs T3 and T4.

Figure 4:
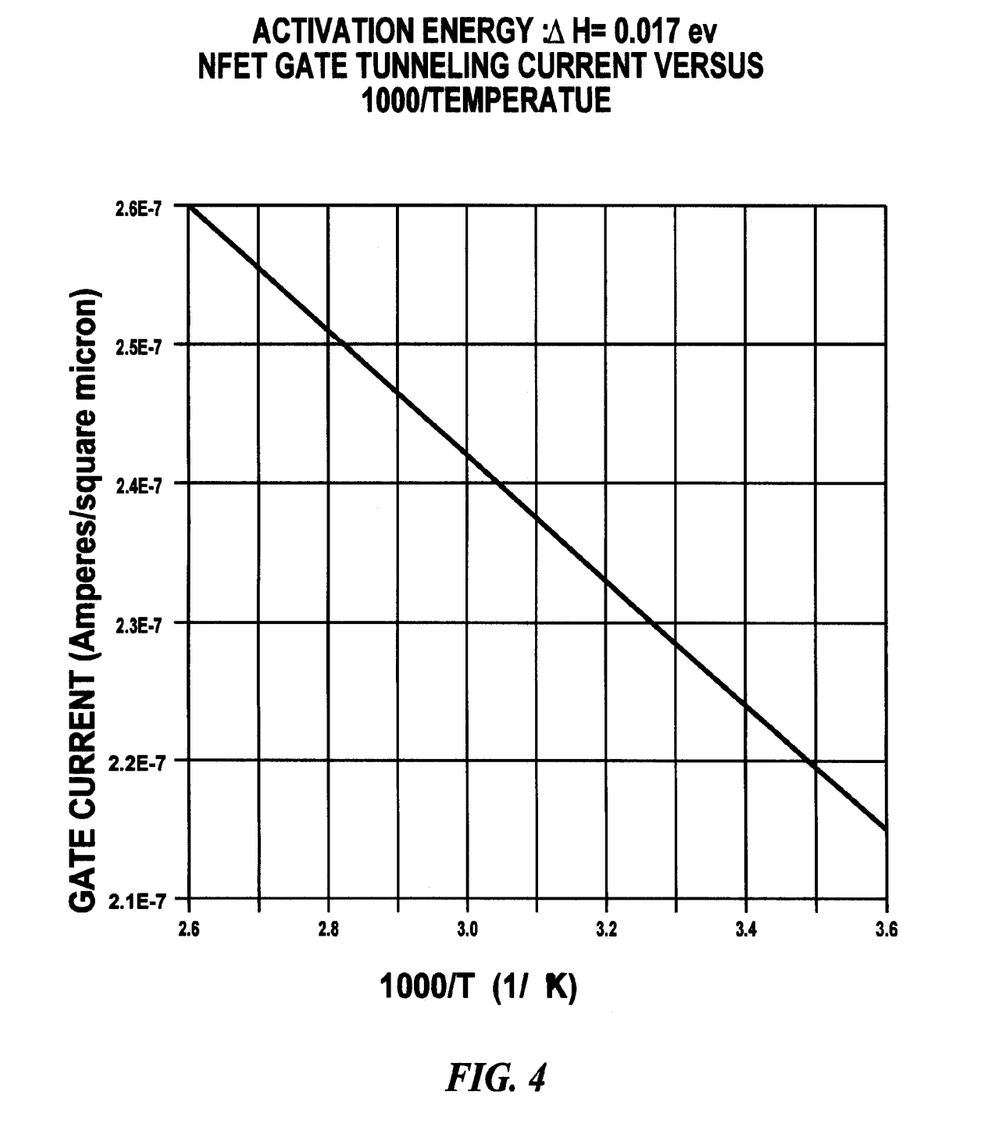
FIG. 4 is a plot of NFET gate tunneling current as a function of temperature.

FIG. 4 is a plot of NFET gate tunneling current as a function of temperature. From FIG. 4, the activation energy ΔH may be calculated to be 0.017 eV.

Returning to FIG. 3, the equation for curves 105 through 125 may be written in the form of equation (1):

$$\ln(I_G) = (AN1 \times T_{OXEQ}) + AN2 \quad (1)$$

where: $I_G$ is the gate tunneling leakage current in amperes/um$^2$,

AN1 is the slope, which is itself a function of gate voltage (see FIG. 5 and equation 2 infra), AN2 is the $T_{OXEQ}$ intercept (the gate dielectric thickness axis of FIG. 3), hereafter intercept, which is itself a function of gate voltage (see FIG. 6 and equation 3 infra) and $T_{OXEQ}$ is the gate dielectric thickness in nm.

Equation (1) is for 25° C. only. A more general equation for any temperature is given by equation (4) described infra.

Figure 5:
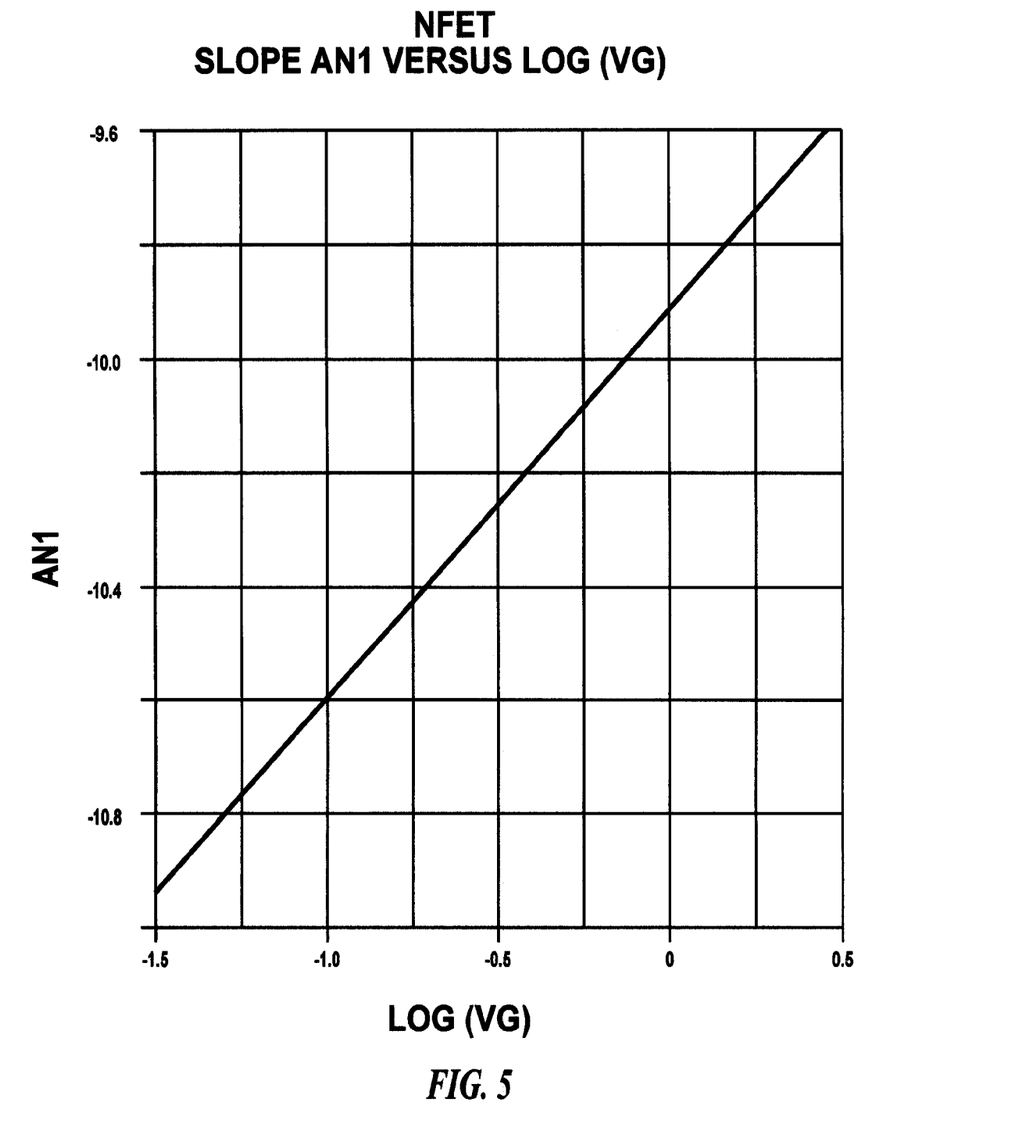
FIG. 5 is a plot of the slope AN1 (for an NFET) as a function of gate voltage.

FIG. 5 is a plot of the slope AN1 (for an NFET) as a function of gate voltage. The equation for FIG. 5 is:

$$AN1 = (0.673 \ln(V_G)) - 9.917 \quad (2)$$

where: $V_G$ is the gate voltage in volts.

Figure 6:
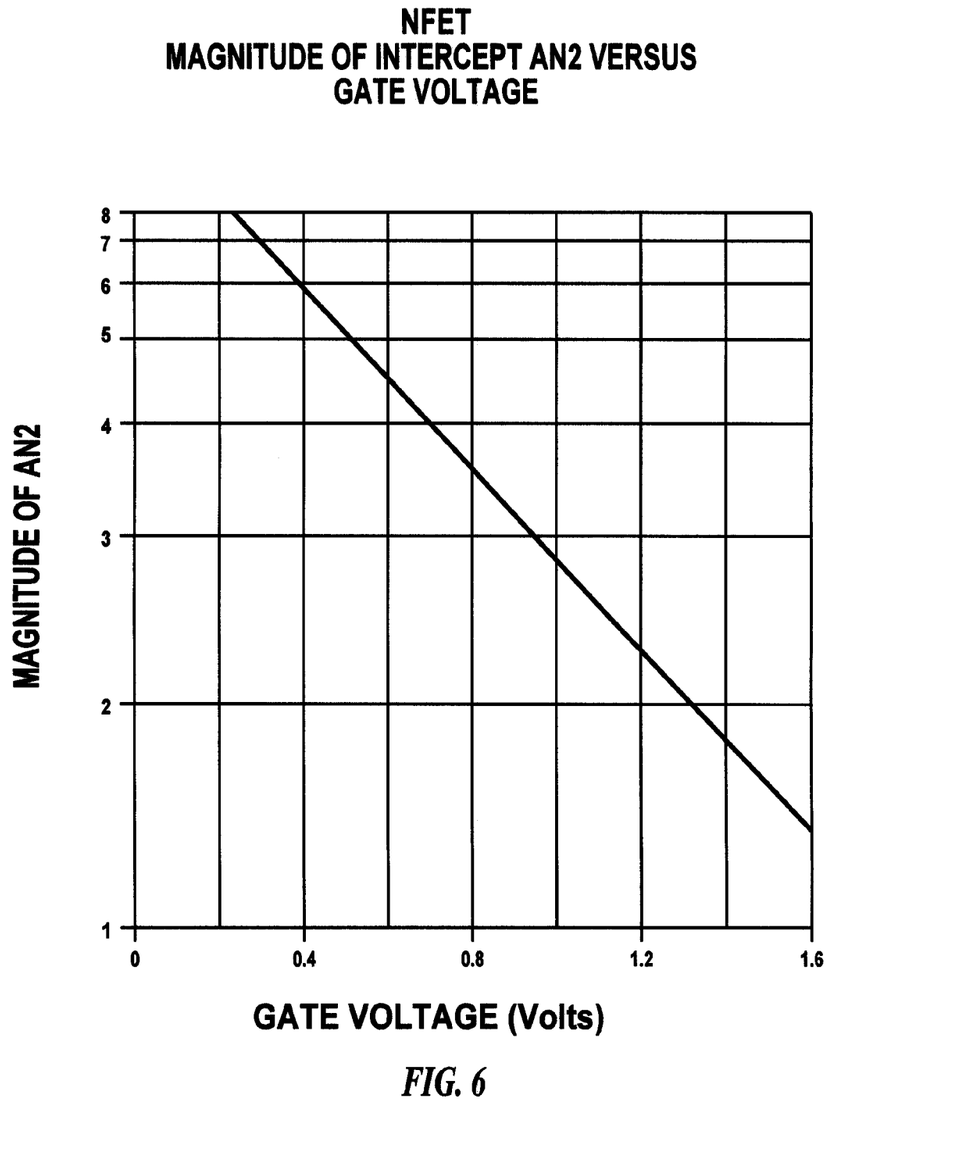
FIG. 6 is a plot of the magnitude of the intercept AN2 (for an NFET) as a function of gate voltage.

FIG. 6 is a plot of the magnitude of the intercept AN2 (for an NFET) as a function of gate voltage. The equation for AN2 is:

$$AN2 = -9.685 e^{(-1.159 \times VG)} \quad (3)$$

where: $V_G$ is the gate voltage in volts.

Equation (4) is a more general version of equation (1) for any temperature:

$$\ln(I_G) = (AN1 \times T_{OXEQ}) + AN2 + \{\Delta H[(1/T1)]/K\} \quad (4)$$

where: K is Bolztmann's constant,

T1 is 298° K. (25° C.), and

T2 is the operating temperature of the NFET is an SRAM cell in ° K.

Equation (4) reduces to equation (1) when T2=25° C.

Figure 7:
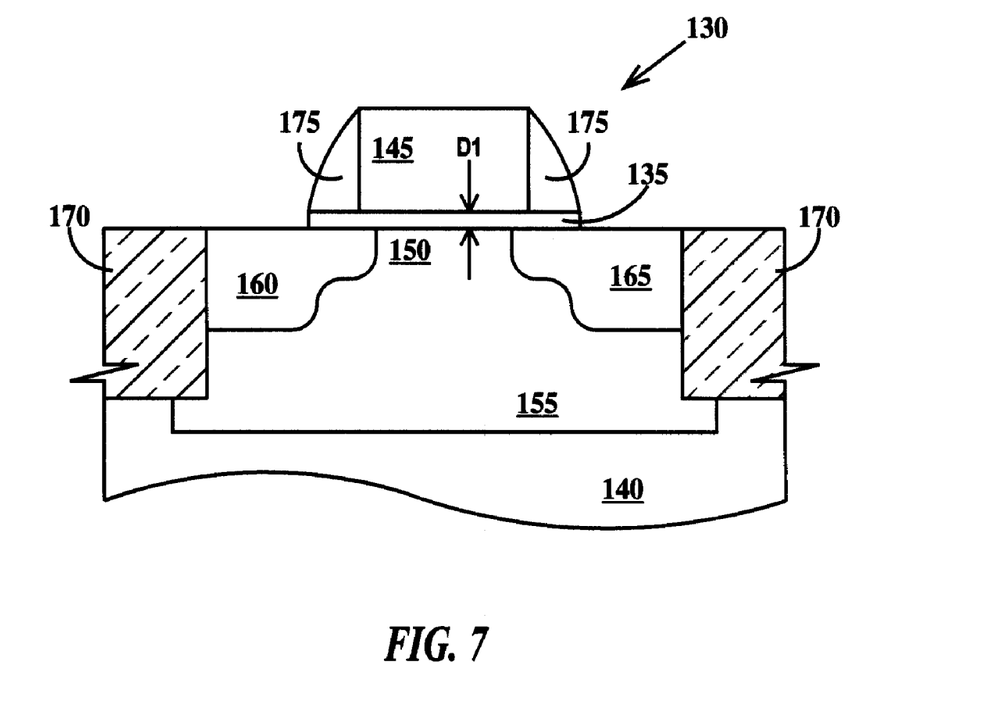
FIG. 7 is a cross-sectional view through an NFET.

FIG. 7 is a cross-sectional view through an NFET. In FIG. 7, an NFET 130 includes a gate dielectric 135 formed on a top surface of a silicon substrate 140, a gate electrode 145 formed over a channel region 150 in a P-well 155 in substrate 140 and a source 160 and a drain 165 formed on opposites sides of channel region 150. NFET 130 is surrounded by shallow trench isolation (STI) 170. Spacers 175 are formed on opposite sides of gate electrode 145. The physical thickness of gate dielectric 135 is D1. Equation (4) may be used to determine a $T_{OXEQ}$ based on a value of $I_G$ for NFETS T5 and T6 (also T3 and T4) (see FIG. 1) required to meet stability and performance specifications for SRAM cell 100 (see FIG. 1). A value for D1 may then be determined from the calculated $T_{OXEQ}$ and the dielectric constant of dielectric layer 135.

Thus, the present invention provides an SRAM cell capable of writing full power supply voltage levels and also provides reduced area requirements and low power consumption.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. An integrated circuit, comprising:
    a node;
    a PFET, a drain of said PFET connected to said node, a source of said PFET connected to a data signal source, a gate of said PFET coupled to a control signal source;
    a first NFET, a drain of said first NFET connected to said node and a source of said first NFET connected to ground; and
    a second NFET, a gate of said second NFET connected to a power supply, a source and a drain of said second NFET both connected to said node;
    wherein a thickness of a gate dielectric of the second NFET is different than a thickness of a gate dielectric of the first NFET.

2. The circuit of claim 1, wherein said thickness of said gate dielectric of said second NFET is less than said thickness of said gate dielectric of said first NFET.

3. The circuit of claim 1, wherein an equivalent oxide thickness of a gate dielectric of said second NFET is less than an equivalent oxide thickness of a gate dielectric of said first NFET.

4. The circuit of claim 1, wherein said second NFET is adapted to supply a gate tunneling leakage current from said power supply to said node, said first NFET is adapted to leak a leakage current from said node to ground, said gate tunneling leakage current is about equal to or greater than said leakage current.

5. The circuit of claim 1, wherein said second NFET is adapted to supply a gate tunneling leakage current from said power supply to said node, said first NFET is adapted to leak a first leakage current from said node to ground, said PFET is adapted to leak a second leakage current from said data signal source to said node, said gate tunneling leakage current plus said second leakage current about equal to or greater than said leakage current.

6. The circuit of claim 1, wherein an equivalent oxide thickness of a gate dielectric of said second NFET is about equal to an equivalent oxide thickness of a gate dielectric of said PFET.

7. The circuit of claim 1, wherein an area of gate over channel of said second NFET is greater than an area of gate over channel of said first NFET.

8. The circuit of claim 1, wherein an absolute voltage difference between said power supply and ground is greater than an absolute difference between a power supply of said data signal and ground.

9. An integrated circuit, comprising:
    a first node and a second node;
    a first PFET, drain of said first PFET connected to said first node, a source of said first PFET connected to a first data signal source, a gate of said first PFET coupled to a control signal source;
    a second PFET, drain of said second PFET connected to said second node, a source of said second PFET connected to a second data signal source, a gate of said first PFET coupled to said control signal source;
    a first NFET, a drain of said first NFET connected to said first node, a source of said first NFET connected to ground, a gate of said first NFET connected to said second node;
    a second NFET, a gate of said second NFET connected to a power supply, a source and a drain of said second NFET both connected to said first node;

a third NFET, a source of said third NFET connected to ground, a drain of said third NFET connected to said second node, a gate of said third NFET connected to said first node; and a fourth NFET, a gate of said fourth NFET connected to said power supply, a source and a drain of said fourth NFET both connected to said second node.

10. The circuit of claim 9, wherein an equivalent oxide thickness of a gate dielectric of said second and fourth NFETs is less than an equivalent oxide thickness of a gate dielectric of said first and third NFETs.

11. The circuit of claim 9, wherein:

said second NFET is adapted to supply a first gate tunneling leakage current from said power supply to said first node, said first NFET is adapted to leak a first leakage current from said first node to ground, said third NFET is adapted to leak a second leakage current from said first node to ground, said first gate tunneling leakage current is about equal to or greater than said first leakage current plus said second leakage current; and said fourth NFET is adapted to supply a first gate tunneling leakage current from said power supply to said first node, said first NFET is adapted to leak a third leakage current from said second node to ground, said third NFET is adapted to leak a fourth leakage current from said second node to ground, said first gate tunneling leakage current is about equal to or greater than said third leakage current plus said fourth leakage current.

12. The circuit of claim 9, wherein:

said second NFET is adapted to supply a first gate tunneling leakage current from said power supply to said first node, said first NFET is adapted to leak a first leakage current from said first node to ground, said third NFET is adapted to leak a second leakage current from said first node to ground, said first PFET is adapted to leak a third leakage current from said data signal source to said first node, said first gate tunneling leakage current plus said third leakage current is about equal to or greater than said first leakage current plus said second leakage current; and said fourth NFET is adapted to supply a second gate tunneling leakage current from said power supply to said first node, said first NFET is further adapted to leak a fourth leakage current from said second node to ground, said third NFET is further adapted to leak a fifth leakage current from said second node to ground, said second PFET is adapted to leak a sixth leakage current from said data signal source to said second node, said second gate tunneling leakage current plus said sixth leakage current is about equal to or greater than said fourth leakage current plus said fifth leakage current.

13. The circuit of claim 9, wherein an equivalent oxide thickness of a gate dielectric of said second and fourth NFETs is about equal to an equivalent oxide thickness of a gate dielectric of said first and second PFETs.

14. The circuit of claim 9, wherein an area of gate over channel of said second and fourth NFETs is greater than an area of gate over channel of said first and third NFETs.

15. The circuit of claim 9, wherein an absolute voltage difference between said power supply and ground is greater than an absolute difference between a power supply of said first and second data signals and ground.

16. A method, comprising:

providing an SRAM cell, said SRAM cell comprising:

a first node and a second node;

a first PFET, drain of said first PFET connected to said first node, a source of said first PFET connected to a first data signal source, a gate of said first PFET coupled to a control signal source;

a second PFET, drain of said second PFET connected to said second node, a source of said second PFET connected to a second data signal source, a gate of said first PFET coupled to said control signal source;

a first NFET, a drain of said first NFET connected to said first node, a source of said first NFET connected to ground, a gate of said first NFET connected to said second node;

a second NFET, a gate of said second NFET connected to a power supply, a source and a drain of said second NFET both connected to said first node;

a third NFET, a source of said third NFET connected to ground, a drain of said third NFET connected to said second node, a gate of said third NFET connected to said first node; and a fourth NFET, a gate of said fourth NFET connected to said power supply, a source and a drain of said fourth NFET both connected to said second node.

17. The method of claim 16, wherein an equivalent oxide thickness of a gate dielectric of said second and fourth NFETs is less than an equivalent oxide thickness of a gate dielectric of said first and third NFETs.

18. The method of claim 16, wherein:

said second NFET is adapted to supply a first gate tunneling leakage current from said power supply to said first node, said first NFET is adapted to leak a first leakage current from said first node to ground, said third NFET is adapted to leak a second leakage current from said first node to ground, said first PFET is adapted to leak a third leakage current from said true bitline to said first node, said first gate tunneling leakage current plus said third leakage current is about equal to or greater than said first leakage current plus said second leakage current; and said fourth NFET is adapted to supply a second gate tunneling leakage current from said power supply to said first node, said first NFET is further adapted to leak a fourth leakage current from said second node to ground, said third NFET is further adapted to leak a fifth leakage current from said second node to ground, said second PFET is adapted to leak a sixth leakage current from said complimentary bitline to said second node, said second gate tunneling leakage current plus said sixth leakage current is about equal to or greater than said fourth leakage current plus said fifth leakage current.

19. The method of claim 16, wherein an equivalent oxide thickness of a gate dielectric of said second and fourth NFETs is about equal to an equivalent oxide thickness of a gate dielectric of said first and second PFETs.

20. The method of claim 16, wherein an area of gate over channel of said second and fourth NFETs is greater than an area of gate over channel of said first and third NFETs.

* * * * *